US006921251B2

(12) United States Patent
Ackerman et al.

(10) Patent No.: US 6,921,251 B2
(45) Date of Patent: Jul. 26, 2005

(54) ALUMINIDE OR CHROMIDE COATING OF TURBINE ENGINE ROTOR COMPONENT

(75) Inventors: John Frederick Ackerman, Laramie, WY (US); Michael James Weimer, Loveland, OH (US); Joseph Aloysius Heaney, Middletown, OH (US); Robert George Zimmerman, Jr., Morrow, OH (US); Bangalore Aswatha Nagaraj, West Chester, OH (US); Brian Thomas Hazel, Cincinnati, OH (US); Nripendra Nath Das, West Chester, OH (US)

(73) Assignee: General Electric Company, Schenectady, NY (US)

( * ) Notice: Subject to any disclaimer, the term of this patent is extended or adjusted under 35 U.S.C. 154(b) by 11 days.

(21) Appl. No.: 10/655,835

(22) Filed: Sep. 5, 2003

(65) Prior Publication Data

US 2005/0053467 A1 Mar. 10, 2005

(51) Int. Cl.$^7$ ................................................ F01D 5/14
(52) U.S. Cl. ............................ 416/241 R; 416/241 B
(58) Field of Search .................... 416/241 R, 241 B; 428/336, 666, 680, 650, 652

(56) References Cited

U.S. PATENT DOCUMENTS

| 4,078,951 | A | | 3/1978 | Denzine et al. | |
|---|---|---|---|---|---|
| 4,568,396 | A | | 2/1986 | Vardiman | |
| 5,077,140 | A | | 12/1991 | Luthra et al. | |
| 5,098,540 | A | | 3/1992 | McKee | |
| 5,660,885 | A | | 8/1997 | Hasz et al. | |
| 5,780,110 | A | | 7/1998 | Schaeffer et al. | |
| 5,795,659 | A | * | 8/1998 | Meelu et al. | 416/241 R |
| 5,900,283 | A | | 5/1999 | Vakil et al. | |
| 6,066,405 | A | * | 5/2000 | Schaeffer | 416/241 R |
| 6,123,997 | A | | 9/2000 | Schaeffer et al. | |
| 6,194,086 | B1 | * | 2/2001 | Nenov et al. | 416/241 B |
| 6,291,084 | B1 | * | 9/2001 | Darolia et al. | 416/241 B |
| 6,797,408 | B2 | * | 9/2004 | Walston et al. | 416/241 R |

* cited by examiner

Primary Examiner—Edward K. Look
Assistant Examiner—Igor Kershteyn
(74) Attorney, Agent, or Firm—Donald E. Hasse; Hasse & Nesbitt, LLC

(57) ABSTRACT

A turbine engine rotor component, such as a compressor or turbine disk or seal element, is protected from corrosion by depositing an aluminum or chromium coating on the component. The deposition can be performed by a vapor deposition process, such as metal organic chemical vapor deposition (MOCVD), to a coating thickness of from about 0.2 to about 50 microns, typically from about 0.5 to about 3 microns. In one embodiment, the method is conducted in a vapor coating container having a hollow interior coating chamber, and includes the steps of loading the coating chamber with the component to be coated; and flowing a tri-alkyl aluminum or chromium carbonyl coating gas into the loaded coating chamber at a specified temperature, pressure, and time to deposit an aluminum or chromium coating on the surface of the component. The coated component is then heated in a nonoxidizing atmosphere to a specified temperature to form an aluminide or chromide coating on the surface. The coated component is typically then heated or maintained at an elevated temperature in the presence of oxygen to form an oxide coating on the surface of the component.

31 Claims, 2 Drawing Sheets

ALUMINIDE OR CHROMIDE COATING OF TURBINE ENGINE ROTOR COMPONENT

BACKGROUND OF THE INVENTION

The present invention relates to a method for forming a protective coating on a turbine engine component. More particularly, the invention relates to forming an aluminide or chromide coating on the surface of a turbine engine rotor component, such as a compressor or turbine disk, seal element or shaft. The coated component is typically then heated or maintained at an elevated temperature in the presence of oxygen to form a protective oxide coating on the surface of the component. The invention also relates to such a coated rotor component.

In an aircraft gas turbine engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine by impingement against the airfoil section of the turbine blades, which turns the shaft and provides power to the compressor. The hot exhaust gases flow from the back of the engine, driving it and the aircraft forward. The hotter the combustion and exhaust gases, the more efficient is the operation of the jet engine. Thus, there is incentive to raise the combustion gas temperature.

The turbine engine includes compressor and turbine disks (sometimes termed compressor and turbine rotors), a number of blades mounted to the compressor and turbine disks and extending radially outwardly therefrom into the gas flow path, and rotating seal elements that channel the airflow and prevent the hot combustion gases from contacting the turbine shaft and related components. As the maximum operating temperature of the turbine engine increases, the compressor and turbine disks and seal elements are subjected to higher temperatures. As a result, oxidation and corrosion of the disks and seal elements have become of greater concern. Alkaline sulfate deposits resulting from ingested dirt and sulfur in the combustion gas are a major source of the corrosion, but other elements in the aggressive combustion and bleed gas environment may also accelerate the corrosion. The oxidation and corrosion damage may lead to premature removal and replacement of the disks and seal elements unless the damage is reduced or repaired.

Turbine and compressor disks and seal elements for use at the highest operating temperatures are made of nickel-base superalloys selected for good elevated temperature toughness and fatigue resistance. These superalloys are selected for their mechanical properties. They have resistance to oxidation and corrosion damage, but that resistance is not sufficient to protect them at the operating temperatures now being reached. Disks and other rotor components made from newer generation alloys may also contain lower levels of aluminum and chromium, and may be more susceptible to corrosion attack.

Turbine and compressor disks and seal elements typically have not been coated to protect them against oxidation and corrosion. A number of oxidation-resistant and corrosion-resistant coatings have been considered for use on turbine blades. These turbine blade coatings are generally too thick and heavy for use on disks and seal elements, and also may adversely affect the fatigue life of the disks and seal elements. There remains a need for protecting disks, seal elements, and other rotor components against oxidation and corrosion as their operating temperatures increase.

BRIEF DESCRIPTION OF THE INVENTION

In one aspect, this invention relates to a method for forming an aluminide or chromide coating on a turbine engine rotor component, the method comprising the steps of:
(a) depositing an aluminum or chromium coating on the surface of the component; and
(b) heating the coated component in a nonoxidizing atmosphere to a temperature of from about 500° C. to about 800° C. to form an aluminide or chromide coating on the surface of the component.

In another aspect, this invention relates to a method for protecting a turbine engine rotor component, comprising the steps of:
(a) providing a rotor component selected from the group consisting of compressor and turbine disks and seal elements;
(b) depositing an aluminum or chromium coating on the rotor component by metal organic chemical vapor deposition, the coating having a thickness of from about 0.2 to about 50 microns; and
(c) heating the coated component in a nonoxidizing atmosphere to a temperature of from about 500° C. to about 800° C. to form an aluminide or chromide coating on the surface of the component.

Another aspect of the invention relates to a method for forming an aluminide or chromide coating on a turbine engine rotor component, the method being conducted in a vapor coating container having a hollow interior coating chamber, the method comprising the steps of:
(a) loading the coating chamber with the component to be coated;
(b) heating the loaded coating chamber to a temperature of from about 240° C. to about 700° C.;
(c) flowing a tri-alkyl aluminum or chromium carbonyl coating gas into the heated coating chamber at a pressure of from about 50 to about 2000 mtorr (about 0.68 to about 27 kgf/m$^2$ for from about 0.25 to about 4 hours to deposit an aluminum or chromium coating on the surface of the component; and then
(d) heating the coated component in a nonoxidizing atmosphere to a temperature of from about 500° C. to about 800° C. to form an aluminide or chromide coating on the surface of the component.

In yet another aspect, the invention relates to a method for forming an oxide coating on a turbine engine rotor component, the method being conducted in a vapor coating container having a hollow interior coating chamber, the method comprising the steps of:
(a) loading the coating chamber with the component to be coated;
(b) heating the loaded coating chamber to a temperature of from about 250° C. to about 600° C.;
(c) flowing a tri-C$_2$–C$_5$ alkyl aluminum or chromium hexacarbonyl coating gas into the heated coating chamber at a pressure of from about 250 to about 700 mtorr (about 3.4 to about 9.5 kgf/m$^2$) for from about 0.25 to about 4 hours to deposit an aluminum or chromium coating on the surface of the component;
(d) heating the coated component in a nonoxidizing atmosphere to a temperature of from about 600° C. to about 700° C. to form an aluminide or chromide coating on the surface of the component; and then
(e) heating or maintaining the component at a temperature of from about 600° C. to about 700° C. in the presence of oxygen to form an oxide coating on the surface of the component.

The invention also relates to a turbine engine rotor component comprising:

(a) a metal-based substrate; and
(b) an aluminide or chromide coating on the surface of the substrate.

DETAILED DESCRIPTION OF THE INVENTION

Figure 1:
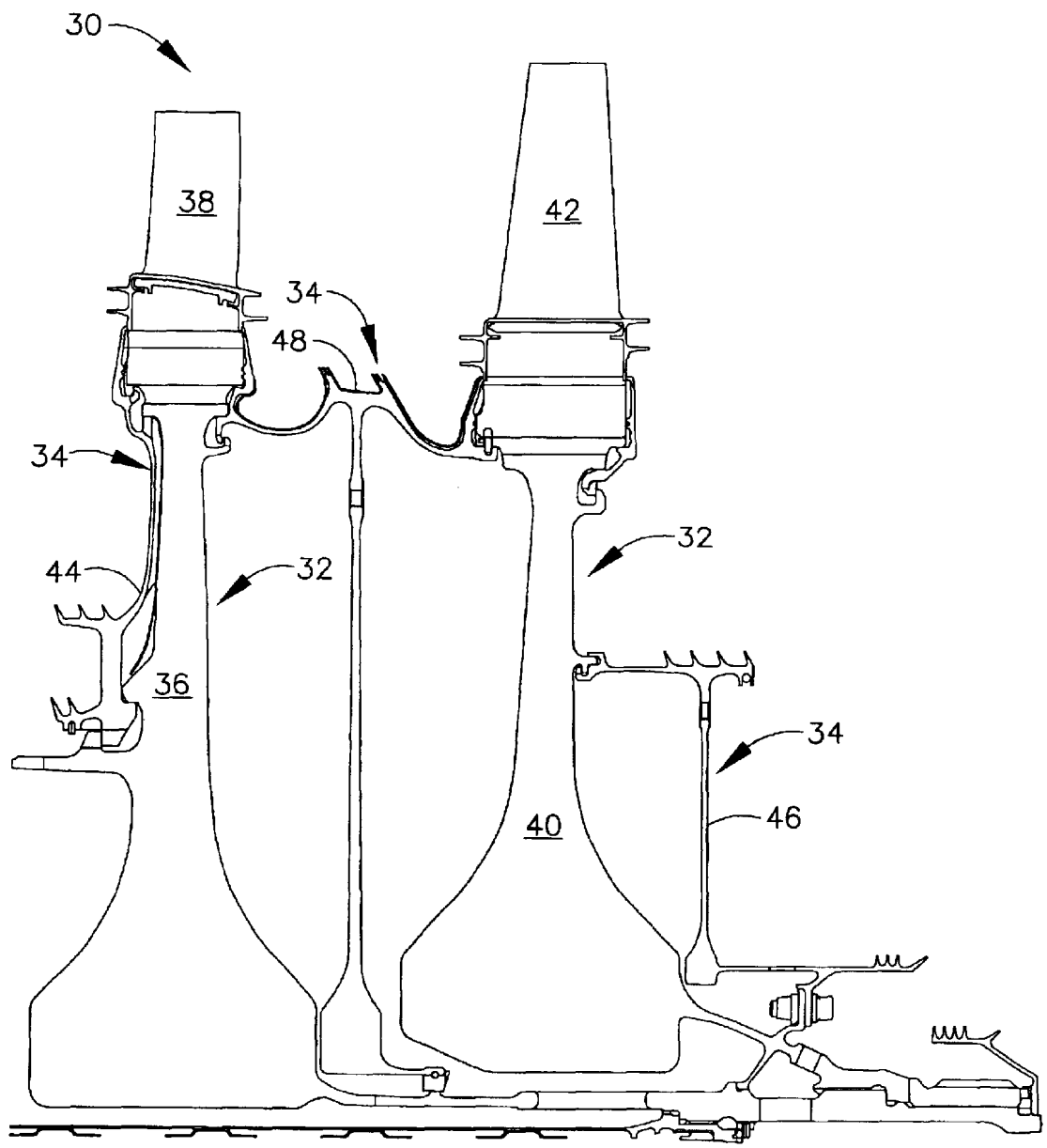
FIG. 1 is a schematic view of a portion of the turbine section of a gas turbine engine.

The invention provides a method for forming a protective coating on a turbine engine rotor component used at a moderately elevated service operating temperature. The approach allows the mechanical performance of the rotor component to be optimized using the best available alloy. The selected alloy is protected against environmental damage by forming an aluminide or chromide protective coating (including combinations thereof) on the rotor component at a relatively low temperature. The coated component is typically then maintained at an elevated temperature in the presence of oxygen to form an oxide coating on the surface of the component. The protective coating formed is highly adherent, does not adversely affect the properties of the underlying base metal, and is thin so that it does not significantly alter the dimensions of the component to which it is applied. The protective coating can also be readily reconditioned and repaired if necessary.

While not intending to be limited by theory, it is believed that aluminum oxide coatings are particularly effective at preventing high temperature corrosion, and that chromium oxide coatings are particularly effective at preventing Type 2 corrosion at lower temperatures. Thus, one may form aluminum oxide or chromium oxide coatings based on the particular corrosion problems expected during operation of the turbine engine rotor component. In some embodiments, mixtures of aluminum and chromium oxide coatings may be more effective at preventing corrosion under a variety of operating conditions experienced by such a rotor component.

The turbine engine rotor component may be of any type, but the present approach is particularly advantageous when used to protect rotor components or portions thereof that experience a service operating temperature of from about 540° C. to about 815° C. Examples of particular interest include all or part of a turbine or compressor disk or seal element. The entire rotor component need not be protected in many cases. For example, the mid-to-outer portion of the hub of the turbine disk may be coated, while the bore region, inner portion of the hub, and blade slots may or may not be coated.

The method of the invention comprises the step of depositing an aluminum or chromium coating (including combinations thereof) on the surface of the rotor component. The aluminum or chromium can be deposited by various methods known in the art, including pack cementation, above the pack, vapor phase, chemical vapor deposition, slurry coating, painting, cathodic arc, filtered cathodic arc, plating, and electroplating processes. In one embodiment, the aluminum or chromium may be deposited by a pack deposition process (e.g., CODEP) or an over-the-pack process (e.g., VPA). Forms of CODEP coating are more fully described in U.S. Pat. No. 3,540,878; U.S. Pat. No. 3,598,638; and U.S. Pat. No. 3,667,985. The aluminum or chromium coating may also be modified with elements such as hafnium, zirconium, yttrium, silicon, titanium, tantalum, cobalt, platinum, palladium, and rare earths (e.g. cerium, lanthanum, erbium, or ytterbium), and combinations thereof, to improve its corrosion resistance and other properties.

After depositing the aluminum or chromium coating, or simultaneously with depositing the coating, the coated component is heated in a nonoxidizing atmosphere, e.g., a gas such as helium or argon, and typically in a vacuum, to a temperature of from about 500° C. to about 800° C., typically from about 600° C. to about 700° C., more typically from about 640° C. to about 700° C., to diffuse the aluminum or chromium into the substrate and form an aluminide or chromide coating on the surface of the component. Depending on the temperature and composition of the rotor component, this step may occur over a wide range in time, e.g., from about 10 minutes to about 24 hours, but typically from about 0.5 to about 10 hours, more typically from about 2 hours to about 8 hours. Alternatively, this heating step may occur simultaneously with the step of depositing the aluminum or chromium coating on the surface of the rotor component.

The coated rotor component is often then heated or maintained at an elevated temperature (e.g., about 450° C. to about 800° C., typically from about 600° C. to about 700° C., more typically from about 650° C. to about 700° C.) in the presence of oxygen to form the desired oxide coating on the surface of the component. The oxide coating may be grown on the substrate simply by exposing it to an oxidizing environment, either as part of the manufacturing operation or, more typically, in service during operation of the turbine engine. In one embodiment, the rotor component is heated or maintained at the above temperature range in a controlled partial pressure of oxygen, for example, from about $10^{-2}$ to about $10^{-5}$ torr (about 136 to about 0.136 gf/m$^2$), to form the desired oxide coating. In a typical case, the step of oxidizing the component includes heating the component to a temperature within the above range for a time of from about 2 to about 8 hours, typically at least 4 hours.

Other features and advantages of the present invention will be apparent from the following more detailed description, taken in conjunction with the accompanying drawings. The scope of the invention is not, however, limited to the described embodiments.

A turbine engine rotor component 30, an example of which is illustrated in FIG. 1, is provided. The rotor component 30 may be of any operable type, for example, a turbine disk 32 or a turbine seal element 34. FIG. 1 schematically illustrates a stage 1 turbine disk 36, a stage 1 turbine blade 38 mounted to the turbine disk 36, a stage 2 turbine disk 40, a stage 2 turbine blade 42 mounted to the turbine disk 40, a forward seal 44, an aft seal 46, and an interstage seal 48. Any or all of these turbine disks 32 and/or turbine seal elements 34 may be provided for coating by the present approach, depending upon whether corrosion is expected or observed. In a typical case, only a portion of the selected rotor component 30 is coated. The turbine blades 38 and 42 are not coated by the present approach.

The turbine engine rotor component is usually made of a nickel-base alloy, typically a nickel-base superalloy. A nickel-base alloy has more nickel than any other element. A nickel-base superalloy is strengthened by the precipitation of gamma prime or a related phase. A nickel-base superalloy of interest is available by the trade name Rene 88, which has a nominal composition, by weight of 13% cobalt, 16% chromium, 4% molybdenum, 3.7% titanium, 2.1% aluminum, 4% tungsten, 0.70% niobium, 0.015% boron, 0.03% zirconium, and 0.03 percent carbon, with the balance nickel and minor impurities.

Figure 2:
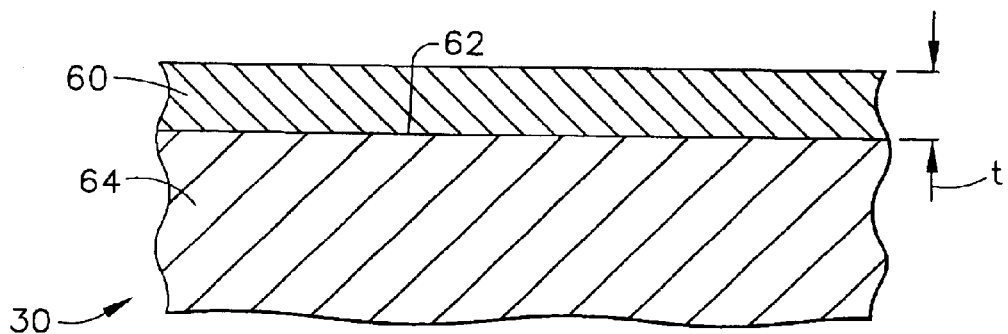
FIG. 2 is a schematic view of an aluminum or chromium coating deposited on a rotor component substrate.

An aluminum or chromium coating is deposited on the rotor component 30, typically by a vapor deposition or a pack deposition process. FIG. 2 illustrates an aluminum or chromium coating 60 deposited on a surface 62 of turbine engine rotor component 30, which thereby serves as a substrate 64 for the coating 60. The aluminum or chromium coating is typically deposited in a thickness of from about 0.2 to about 50 microns, although the coating usually has a thickness of from about 0.3 to about 10 microns, e.g., from about 0.5 to about 3 microns.

The aluminum or chromium coating 60 is typically deposited upon the surfaces 62 of those portions of the rotor component 30 that experience a service operating temperature of from about 540° C. to about 815° C. The coating 60 is usually not needed on those portions, such as the portions of turbine disk 32 near the center bore, whose service operating temperature is less than about 540° C. because the natural oxidation and corrosion resistance of the materials of construction provide sufficient resistance. In that case, the coating 60 is an unnecessary weight and expense. More complex protective coatings, such as thicker aluminide diffusion coatings or overlay coatings, and optionally thermal barrier coatings, are often used on those portions of turbine engine components whose service operating temperature is greater than about 815° C.

Figure 3:
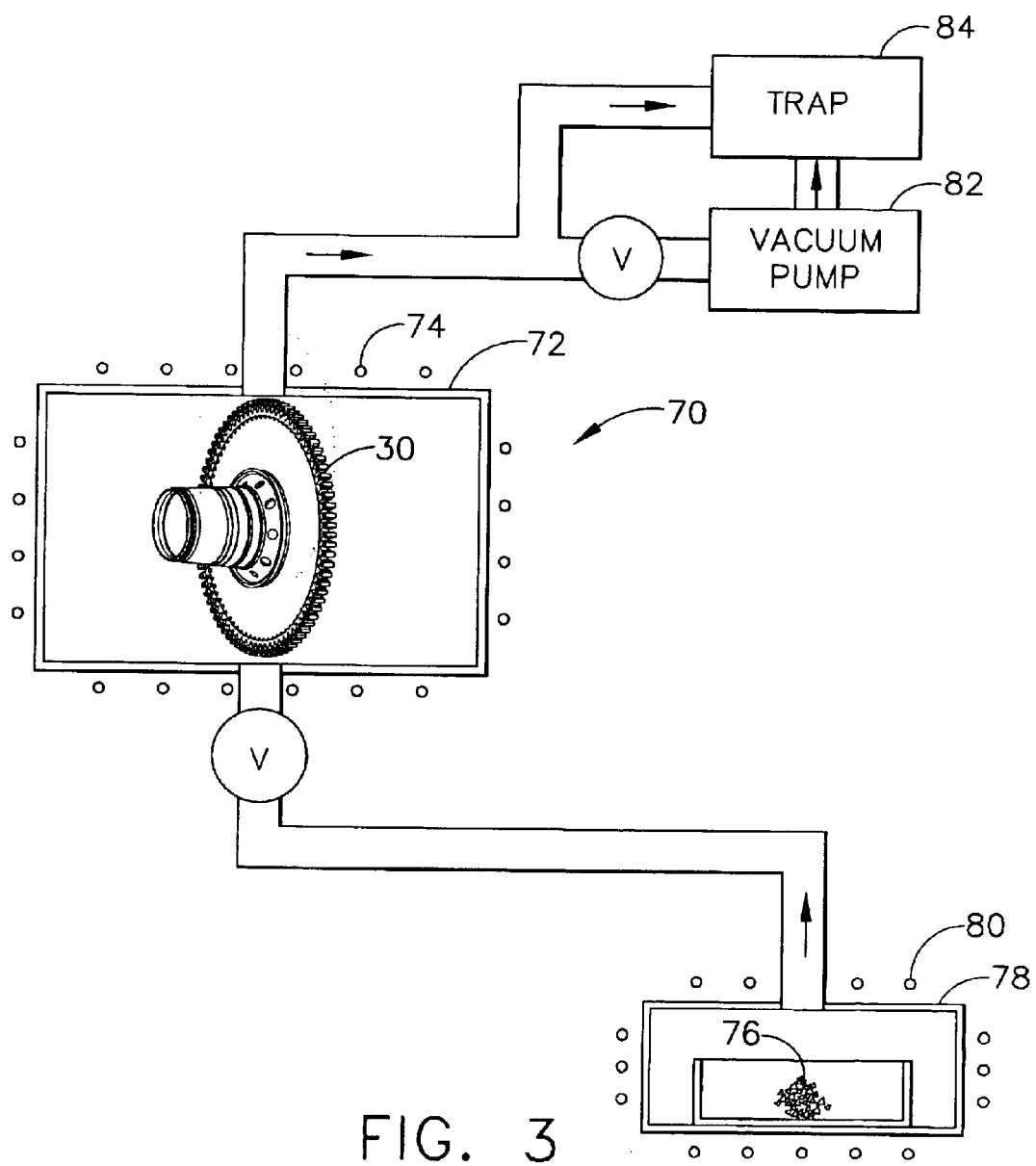
FIG. 3 is a schematic view of an embodiment of a vapor coating apparatus for coating turbine rotor components.

The aluminum or chromium coating 60 typically is deposited by a vapor deposition process, such as a metal organic chemical vapor deposition (MOCVD) process. FIG. 3 illustrates a vapor coating apparatus 70 in which such an MOCVD deposition may be performed. The vapor coating apparatus 70 includes a coating container 72 in which the turbine engine rotor component 30 to be coated is placed. Those portions of the rotor component 30 that are not to be coated may be masked prior to placement in the coating container 72. The coating container 72 is heated to the desired deposition temperature by appropriate heaters 74, such as resistance elements.

One feature of the MOCVD process is that the rotor component 30 upon which the coating 60 is deposited is heated to a relatively low temperature during the deposition process. The rotor component 30 is typically a forged or otherwise mechanically worked alloy, which is subjected to heat treatments and other processing to attain specific microstructures and other structures that are beneficial to subsequent functionality. A high deposition temperature could adversely affect this structure. The deposition temperature to which the rotor component 30 is heated in the coating container 72 depends upon the material being deposited. In many cases, however, that deposition temperature is in the range of about 400–510° C., below the expected service operating temperature of the coated portion of the rotor component 30. In some cases, the deposition temperatures are higher, but these are used with care and consideration to avoid adverse effects on the underlying rotor component 30.

The reagents 76 that produce a deposition vapor are placed into a reagent source chamber 78 that is heated by heaters 80. The reagents 76 are organic chemical compounds that contain the elements to be deposited. In one embodiment, reagents 76 are organic chemical compounds that produce a tri-alkyl aluminum vapor that transports the aluminum and other optional elements that form the coating 60. In one embodiment, the tri-alkyl aluminum is tri-$C_2$–$C_6$ alkyl aluminum, typically tri-$C_3$–$C_5$ alkyl aluminum, e.g., tri-butyl aluminum. N-butyl groups are preferred, although iso-butyl and t-butyl groups may also be used. The reagents 76 produce an organic vapor that contains and transports the metal and all other elements needed to form the coating 60. In another embodiment, reagents 76 are organic chemical compounds that produce a chromium carbonyl vapor that transports the chromium and other optional elements that form the coating 60. In one embodiment, the chromium carbonyl is chromium hexacarbonyl, typically $Cr(CO)_6$, although chromiumdicarbonylbis (cyclohexadiene) and chromiumtricarbonylarenes may also be used.

The vapor produced from the reagent source chamber 78 flows to the coating container 72 and thence around the rotor component 30 to deposit upon its surface 62. Another feature of the MOCVD process is that it is a non-line-of-sight process, in which the aluminum or chromium is deposited upon portions of the substrate that are not visible from an external source, ensuring complete coverage and protection. The metal-bearing vapors flow around the component being coated, reaching regions not readily accessible by line-of-sight deposition processes.

The deposition is normally conducted in a reduced-pressure environment, so that the coating container 72 is provided as a vacuum chamber. A vacuum pump 82 is provided to evacuate the coating container 72 as needed. A trap 84 traps, filters, and condenses the released organic vapors that are removed from the coating container 72 either directly or by the vacuum pump 82.

A thickness t of the aluminum or chromium coating 60 (FIG. 2) is determined in part by the nature of the metal organic vapor, the pressure at which the coating gas is flowed into the coating container, the temperature of deposition, and the time of exposure of the rotor component 30 to the metal organic vapor. The thickness t of the coating 60 is typically from about 0.2 to about 50 microns. More often, the thickness t of the coating 60 is from about 0.3 to about 10 microns, e.g., from about 0.5 to about 3 microns. The coating 60 typically is relatively thin to avoid significantly altering the dimensions of the coated component. However, if the coating 60 is too thin, such as less than about 0.2 microns, there may be incomplete coverage of the surface 62 (i.e., bare spots) and insufficient thickness to resist oxidation and corrosion of the protected substrate 64. A thickness of the coating in the range of about 0.5 to about 3 microns, typically about 1 to about 2 microns, provides a balance of good adhesion of the coating to the surface and good protection of the substrate.

In one embodiment, the process involves heating the coating chamber containing the rotor component 30 to be coated to a temperature of from about 240° C. to about 450° C., typically from about 245° C. to about 400° C., more typically from about 250° C. to about 300° C. (e.g., from about 260° C. to about 280° C.). A tri-alkyl aluminum coating gas is then flowed into the loaded coating chamber at a pressure of from about 50 to about 2000 mtorr (about 0.68 to about 27 kgf/$m^2$), typically from about 100 to about 1500 mtorr (about 1.4 to about 20.4 kgf/$m^2$), more typically from about 250 to about 700 mtorr (about 3.4 to about 9.5 kgf/$m^2$), e.g., from about 450 to about 550 mtorr (about 6.1 to about 7.5 kgf/$m^2$), for from about 0.25 to about 4 hours, typically from about 0.5 to about 2 hours, more typically from about 0.75 to about 1.5 hours, while maintaining the loaded coating chamber at the above temperature range, to deposit an aluminum coating on the surface of the rotor component 30. Under the above conditions, the aluminum coating is deposited at a rate of from about 0.1 to about 10 microns per hour, typically from about 0.5 to about 5 microns per hour, and more typically from about 1 to about 2 microns per hour. The aluminum coating may contain minor amounts of other metals as described above, buy typically is at least substantially pure, and often is pure aluminum.

In another embodiment, the process involves heating the coating chamber containing the rotor component 30 to be coated to a temperature of from about 240° C. to about 700° C., typically from about 350° C. to about 600° C., more typically from about 400° C. to about 450° C. A hexacarbonyl chromium coating gas is then flowed into the loaded coating chamber at a pressure of from about 50 to about 2000 mtorr (about 0.68 to about 27 $kgf/m^2$), typically from about 100 to about 1500 mtorr (about 1.4 to about 20.4 $kgf/m^2$), more typically from about 250 to about 700 mtorr (about 3.4 to about 9.5 $kgf/m^2$), e.g., from about 450 to about 550 mtorr (about 6.1 to about 7.5 $kgf/m^2$), for from about 0.5 to about 4 hours, typically from about 1 to about 2 hours, while maintaining the loaded coating chamber at the above temperature range, to deposit an chromium coating on the surface of the rotor component 30. Under the above conditions, the chromium coating is deposited at a rate of from about 0.1 to about 10 microns per hour, typically from about 0.5 to about 5 microns per hour, and more typically from about 1 to about 2 microns per hour. The chromium coating may contain minor amounts of other metals as described above, but typically is at least substantially pure, and often is pure chromium.

The coated rotor component 30 is then heated in a nonoxidizing atmosphere, e.g., a gas such as helium or argon, and typically in a vacuum, in coating container 72 to a temperature of from about 500° C. to about 800° C., typically from about 600° C. to about 700° C., more typically from about 640° C. to about 700° C., to diffuse the aluminum or chromium into the substrate and form an aluminide or chromide coating on the surface of the rotor component. Depending on the temperature and composition of the rotor component and the coating, this step may occur over a wide range in time, e.g., from about 10 minutes to about 24 hours, but typically from about 0.5 to about 10 hours. Alternatively, this heating step may occur simultaneously with the step of depositing the aluminum or chromium coating on the surface of the rotor component.

The coated rotor component is then heated or maintained at a temperature of from about 450° C. to about 800° C., typically from about 550° C. to about 750° C., more typically from about 600° C. to about 700° C. (e.g., the component is heated or allowed to cool to a temperature within that range), in the presence of oxygen to form the desired oxide protective coating on the surface of the component. Heating may be accomplished in the coating container 72, in an air furnace as a separate step, or, more typically, during operation of the turbine engine. This oxidizing step may be performed in an air atmosphere, so that there is some formation of nitrides as well. The oxidizing step may also be performed in an oxygen-only atmosphere such as one containing from about 0.2 to about 1000 parts per million of oxygen. In a typical case, the step of oxidizing the component includes heating the component to a temperature within the above range, for a time of at least about 1 hour, typically at least about 2 hours, e.g., about 4 hours.

While the above embodiments have been described in the context of coating turbine engine disks, the present invention can be used to form an aluminide or chromide coating on surfaces of various turbine engine rotor components, including compressor disks, seals, and shafts, which can then be exposed to oxygen at an elevated temperature to form the desired oxide coating, as described above.

The following examples illustrate some embodiments of this invention, but should not be construed to be any sort of limitation on its scope. In the examples, the test disks are high-pressure gas turbine engine components made from a nickel-based superalloy, available by the trade name René 88.

EXAMPLE 1

A process of the invention is used to form an aluminide coating on turbine disks in the coating container shown in FIG. 3. The disks are loaded into the coating container and heated to a temperature of about 270° C. A tri-n-butyl aluminum coating gas is then flowed into the coating container at a pressure of about 500 mtorr (about 6.8 $kgf/m^2$) for about 5 hours to force the aluminum coating vapors to flow around the disks, thereby depositing an aluminum coating on the surface of the disks. The thickness of the aluminum coating is controlled by the temperature, gas flow, and elapsed time of the gas flow. The coated disks are then heated in a vacuum to a temperature of about 670° C. for about 5 hours to form an aluminide coating on the surface of the disks. The disks are then heated to a temperature of about 700° C. for 8 hours in the presence of oxygen at a partial pressure of about $10^{-3}$ torr (about 13.6 $gf/m^2$) to form an oxide protective coating on the surface of the disks. The oxide coating formed has a thickness of about 1 micron.

EXAMPLE 2

A process of the invention is used to form an aluminide coating on turbine disks in the coating container shown in FIG. 3. The disks are loaded into the coating container and heated to a temperature of about 450° C. A tri-n-butyl aluminum coating gas is then flowed into the coating container at a pressure of about 100 mtorr (about 1.4 $kgf/m^2$) for about 1 hour to force the aluminum coating vapors to flow around the disks, thereby depositing an aluminum coating on the surface of the disks. The thickness of the aluminum coating is controlled by the temperature, gas flow, and elapsed time of the gas flow. The coated disks are then heated in a vacuum to a temperature of about 670° C. for about 1 hour to form an aluminide coating on the surface of the disks. The disks are then heated to a temperature of about 700° C. for 8 hours in the presence of oxygen at a partial pressure of about $10^{-3}$ torr (about 13.6 $gf/m^2$) to form an oxide protective coating on the surface of the disks. The oxide coating formed has a thickness of about 1 micron.

EXAMPLE 3

A process of the invention is used to form an chromide coating on turbine disks in the coating container shown in FIG. 3. The disks are loaded into the coating container and heated to a temperature of about 600° C. A hexacarbonyl chromium coating gas is then flowed into the coating container at a pressure of about 1000 mtorr (about 14 $kgf/m^2$) for about 1 hour to force the chromium coating vapors to flow around the disks, thereby depositing an chromium coating on the surface of the disks. The thickness of the chromium coating is controlled by the temperature, gas flow, and elapsed time of the gas flow. The coated disks are then heated in a vacuum to a temperature of about 670° C. for about 1 hour to form an chromide coating on the surface of the disks. The disks are then heated to a temperature of about 700° C. for 8 hours in the presence of oxygen at a partial pressure of about $10^{-3}$ torr (about 13.6 gf/m$^2$) to form an oxide protective coating on the surface of the disks. The oxide coating formed has thickness of about 1.5 microns.

Various embodiments of this invention have been described. However, this disclosure should not be deemed to be a limitation on the scope of the invention. Accordingly, various modifications, adaptations, and alternatives may occur to one skilled in the art without departing from the spirit and scope of the claimed invention.

What is claimed is:

1. A method for forming an aluminide or chromide coating on a turbine engine rotor component, the method comprising the steps of:
   (a) depositing an aluminum or chromium coating on the surface of the component; and
   (b) heating the coated component in a nonoxidizing atmosphere to a temperature of from about 500° C. to about 800° C. to form an aluminide or chromide coating on the surface of the component.

2. The method of claim 1 wherein the rotor component is a compressor or turbine disk.

3. The method of claim 1 wherein the rotor component is a compressor or turbine seal element.

4. The method of claim 1 wherein the rotor component has a service operating temperature of from about 540° C. to about 815° C.

5. The method of claim 1 wherein the aluminum or chromium coating is deposited by metal organic chemical vapor deposition.

6. The method of claim 1 wherein the aluminum or chromium coating has a thickness of from about 0.2 to about 50 microns.

7. The method of claim 6 wherein the coating has a thickness of from about 0.5 to about 3 microns.

8. A method for protecting a turbine engine rotor component, comprising the steps of:
   (a) providing a rotor component selected from the group consisting of compressor and turbine disks and seal elements;
   (b) depositing an aluminum or chromium coating on the rotor component by metal organic chemical vapor deposition, the coating having a thickness of from about 0.2 to about 50 microns; and
   (c) heating the coated component in a nonoxidizing atmosphere to a temperature of from about 500° C. to about 800° C. to form an aluminide or chromide coating on the surface of the component.

9. The method of claim 8, wherein the rotor component has a service operating temperature of from about 540° C. to about 815° C.

10. The method of claim 8, wherein the coating has a thickness of from about 0.5 to about 3 microns.

11. A method for forming an aluminide or chromide coating on a turbine engine rotor component, the method being conducted in a vapor coating container having a hollow interior coating chamber, the method comprising the steps of:
   (a) loading the coating chamber with the component to be coated;
   (b) heating the loaded coating chamber to a temperature of from about 240° C. to about 700° C.;
   (c) flowing a tri-alkyl aluminum or chromium carbonyl coating gas into the heated coating chamber at a pressure of from about 50 to about 2000 mtorr (about 0.68 to about 27 kgf/m$^2$ for from about 0.25 to about 4 hours to deposit an aluminum or chromium coating on the surface of the component; and then
   (d) heating the coated component in a nonoxidizing atmosphere to a temperature of from about 500° C. to about 800° C. to form an aluminide or chromide coating on the surface of the component.

12. The method of claim 11 wherein the coating gas is a tri-$C_3$–$C_5$ alkyl aluminum or chromium carbonyl gas.

13. The method of claim 12 wherein the coating gas is tri-butyl aluminum or chromium hexacarbonyl gas.

14. The method of claim 11 wherein during step (b), the loaded coating chamber is heated at a temperature of from about 250° C. to about 300° C. when tri-alkyl aluminum coating gas is flowed into the chamber during step (c), and is heated at a temperature of from about 350° C. to about 600° C. when chromium carbonyl coating gas is flowed into the chamber during step (c).

15. The method of claim 14 wherein during step (c), the coating gas is flowed at a pressure of from about 250 to about 700 mtorr (about 3.4 to about 9.5 kf/m$^2$) for from about 0.5 to about 2 hours.

16. The method of claim 15 wherein the coating gas is tri-$C_3$–$C_5$ alkyl aluminum or chromium hexacarbonyl gas.

17. The method of claim 16 wherein during step (d), the coated component is heated in a vacuum to a temperature of from about 640° C. to about 700° C.

18. The method of claim 11 further comprising a step (e) of maintaining the component at a temperature of from about 450° C. to about 800° C. in the presence of oxygen to form an oxide coating on the surface of the component.

19. The method of claim 18 wherein the temperature during step (e) is from about 600° C. to about 700° C.

20. The method of claim 17 further comprising a step (e) of maintaining the component at a temperature of from about 600° C. to about 700° C. in the presence of oxygen to form an oxide coating on the surface of the component.

21. A method for forming an oxide coating on a turbine engine rotor component, the method being conducted in a vapor coating container having a hollow interior coating chamber, the method comprising the steps of:
   (a) loading the coating chamber with the component to be coated;
   (b) heating the loaded coating chamber to a temperature of from about 250° C. to about 600° C.;
   (c) flowing a tri-$C_2$–$C_5$ alkyl aluminum or chromium hexacarbonyl coating gas into the heated coating chamber at a pressure of from about 250 to about 700 mtorr (about 3.4 to about 9.5 kgf/m$^2$) for from about 0.25 to about 4 hours to deposit an aluminum or chromium coating on the surface of the component;
   (d) heating the coated component in a nonoxidizing atmosphere to a temperature of from about 600° C. to about 700° C. to form an aluminide or chromide coating on the surface of the component; and then
   (e) heating or maintaining the component at a temperature of from about 600° C. to about 700° C. in the presence of oxygen to form an oxide coating on the surface of the component.

22. The method of claim 21 wherein the coating gas is tri-butyl aluminum or chromium hexacarbonyl gas.

23. The method of claim 21 wherein during step (c) the coating gas is flowed at a pressure of from about 450 to about 550 mtorr (about 6.1 to about 7.5 kgf/m$^2$) for from about 0.5 to about 2 hours.

24. The method of claim 23 wherein during step (d) the coated component is heated to a temperature of from about 640° C. to about 700° C. for from about 2 to about 8 hours.

25. A turbine engine rotor component comprising:
(a) a metal-based substrate; and
(b) an aluminide or chromide coating on the surface of the substrate;
wherein the aluminide or chromide coating is formed by depositing an aluminum or chromium coating on the surface of the component, and heating the coated component in a nonoxidizing atmosphere to a temperature of from about 500° C. to about 800° C. to form an aluminide or chromide coating on the surface of the component.

26. The rotor component of claim 25 that is a compressor or turbine disk.

27. The rotor component of claim 25 that is a compressor or turbine seal element.

28. The rotor component of claim 25 wherein the aluminide or chromide coating is formed by depositing an aluminum or chromium coating by metal organic chemical vapor deposition, and heating the coated component in a nonoxidizing atmosphere to a temperature of from about 500° C. to about 800° C. to form an aluminide or chromide coating on the surface of the substrate.

29. The rotor component of claim 25 wherein the aluminide or chromide coating has a thickness of from about 0.2 to about 50 microns.

30. The rotor component of claim 29 wherein the coating has a thickness of from about 0.5 to about 3 microns.

31. The rotor component of claim 25 further comprising an oxide coating on the surface of the component.

* * * * *